United States Patent
Yamamoto et al.

(10) Patent No.: US 12,454,634 B2
(45) Date of Patent: Oct. 28, 2025

(54) ADHESIVE COMPOSITION, THERMOSETTING ADHESIVE SHEET, AND PRINTED WIRING BOARD

(71) Applicant: DEXERIALS CORPORATION, Shimotsuke (JP)

(72) Inventors: Jun Yamamoto, Shimotsuke (JP); Akira Suzuki, Shimotsuke (JP); Toshiyuki Minegishi, Shimotsuke (JP); Kazuhiro Date, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

(21) Appl. No.: 17/630,070

(22) PCT Filed: Aug. 6, 2019

(86) PCT No.: PCT/JP2019/030802
§ 371 (c)(1),
(2) Date: Jan. 25, 2022

(87) PCT Pub. No.: WO2021/024364
PCT Pub. Date: Feb. 11, 2021

(65) Prior Publication Data
US 2022/0267650 A1  Aug. 25, 2022

(51) Int. Cl.
*C09J 153/02* (2006.01)
*B32B 7/12* (2006.01)
(Continued)

(52) U.S. Cl.
CPC ............. *C09J 153/025* (2013.01); *B32B 7/12* (2013.01); *B32B 25/08* (2013.01); *B32B 25/14* (2013.01);
(Continued)

(58) Field of Classification Search
CPC .................. H05K 3/305; H05K 1/036; H05K 2201/0141; H05K 3/281; H05K 1/03;
(Continued)

(56) References Cited

U.S. PATENT DOCUMENTS

2009/0309073 A1* 12/2009 Takagi .................... C08L 77/02
252/511
2017/0259544 A1 9/2017 Okimura et al.

FOREIGN PATENT DOCUMENTS

CN 106536658 A 3/2017
CN 106574110 A 4/2017
(Continued)

OTHER PUBLICATIONS

Machine translation of JP 2016-027131. (Year: 2016).*
(Continued)

*Primary Examiner* — John D Freeman
(74) *Attorney, Agent, or Firm* — Oliff PLC

(57) ABSTRACT

An adhesive composition having a low dielectric constant, low dielectric loss tangent, excellent folding endurance, and excellent heat resistance. The adhesive composition includes: with respect to the total of 100 parts by mass of the adhesive composition, 70 to 90 parts by mass of the styrene elastomer; 5 to 25 parts by mass of a modified polyphenyleneether resin having a polymerizable group at an end; totally 10 parts by mass or less of an epoxy resin and an epoxy resin curing agent, wherein the styrene ratio of the styrene elastomer is less than 42%.

10 Claims, 5 Drawing Sheets

1

(51) Int. Cl.
  *B32B 25/08*    (2006.01)
  *B32B 25/14*    (2006.01)
  *H05K 3/28*     (2006.01)

(52) U.S. Cl.
  CPC .......... *B32B 2457/08* (2013.01); *H05K 3/281* (2013.01); *H05K 2201/0141* (2013.01); *H05K 2201/0154* (2013.01)

(58) Field of Classification Search
  CPC .. H05K 2201/0154; B32B 7/12; B32B 25/08; B32B 2457/08; B32B 27/00; B32B 25/14; C09J 125/04; C09J 153/025; C09J 11/06; C09J 163/00; C09J 171/00; C09J 153/02; C09J 7/22; C09J 7/387; C08L 63/00; C08L 71/12; C08L 71/126
  See application file for complete search history.

(56) References Cited

FOREIGN PATENT DOCUMENTS

| JP | 2008-248001 A | 10/2008 |
| JP | 2015131866 A * | 7/2015 |
| JP | 2016-027131 A | 2/2016 |
| JP | 2016-079354 A | 5/2016 |
| JP | 2017-057346 A | 3/2017 |
| KR | 10-2017-0040184 A | 4/2017 |
| KR | 10-2017-0071470 A | 6/2017 |
| WO | 2016/017473 A1 | 2/2016 |

OTHER PUBLICATIONS

Chemical Datasheet "2,5-dimethyl-2,5-di-(tert-butylperoxy)hexane". Cameo Chemicals. https://cameochemicals.noaa.gov/chemical/3259. Accessed Oct. 7, 2023. (Year: 2023).*
Asahi Kasei "Hydrogenated Styrenic Thermoplastic Elastomer (SEBS) Tuftec™". Undated. www.akelastomer.com/en/products/tuftec/. Accessed Mar. 27, 2024. (Year: 2024).*
Aug. 26, 2022 Office Action issued in Chinese Patent Application No. 201980098858.7.
Nov. 5, 2019 International Search Report issued in International Patent Application No. PCT/JP2019/030802.
Mar. 15, 2023 Office Action issued in Chinese Patent Application No. 201980098858.7 .
Yoshitaka, "Polymer Material," 2007, p. 155.
Aug. 10, 2023 Office Action issued in Korean Patent Application No. 10-2022-7002765.

* cited by examiner

ADHESIVE COMPOSITION, THERMOSETTING ADHESIVE SHEET, AND PRINTED WIRING BOARD

TECHNICAL FIELD

This technology relates to an adhesive composition, a thermosetting adhesive sheet, and a printed wiring board.

BACKGROUND ART

With the increase in the speed and capacity of information communications, the trend of increasing the frequency of signals flowing through printed circuit boards is accelerating. Accordingly, low dielectric properties such as low dielectric constant and low dielectric loss tangent are required for constituent materials (for example, an adhesive composition) of a rigid substrate or a flexible printed wiring board (FPC) (see PLT 1 and 2, for example). As with the conventional printed wiring board, high-frequency printed wiring boards also requires high heat resistance for mounting components and connecting with another printed wiring board by, e.g., a solder reflow process or a hot bar solder process.

Although polyphenyleneether has many advantages as a substrate material having low dielectric properties, it lacks folding endurance since polyphenyleneether has a very high melting point (softening point) and a hard property at ordinary temperature. For example, as in the resin composition described in PLT 2, when approximately 30 to 50% of the entire resin is composed of polyphenyleneether, the folding endurance tends to be inferior.

CITATION LIST

Patent Literature

PLT 1: Japanese Unexamined Patent Application Publication No. 2017-57346
PLT 2: Japanese Unexamined Patent Application Publication No. 2016-79354

SUMMARY OF INVENTION

Technical Problem

The present technology has been proposed in view of such conventional circumstances, and provides an adhesive composition, a thermosetting adhesive sheet, and a printed wiring board having a low dielectric constant, a low dielectric dissipation factor, an excellent folding endurance, and an excellent heat resistance.

Solution to Problem

An adhesive composition according to the present technology includes: with respect to the total of 100 parts by mass of the adhesive composition, 70 to 90 parts by mass of the styrene elastomer; 5 to 25 parts by mass of a modified polyphenyleneether resin having a radical polymerizable group at an end; totally 10 parts by mass or less of an epoxy resin, an epoxy resin curing agent, and a peroxide, wherein the styrene ratio of the styrene elastomer is less than 42%.

An adhesive composition according to the present technology includes: with respect to the total of 100 parts by mass of the adhesive composition, 70 to 90 parts by mass of the styrene elastomer; 5 to 25 parts by mass of a modified polyphenyleneether resin having a radical polymerizable group at an end; totally 10 parts by mass or less of an epoxy resin and a peroxide, wherein the styrene ratio of the styrene elastomer is 42% or less, and wherein the styrene elastomer has a functional group for promoting the curing reaction of the epoxy resin.

A thermosetting adhesive sheet according to the present technology includes a base material and a thermosetting adhesive layer formed on the base material and composed of the adhesive composition described above.

A printed wiring board according to the present technology includes: a wiring resin substrate having a base material and a wiring pattern; and a cover lay laminated on the wiring pattern of the resin substrate via a cured product of the adhesive composition described above.

Advantageous Effects of Invention

The present technology can provide an adhesive composition having a low dielectric constant, a low dielectric dissipation factor, an excellent folding endurance, and an excellent heat resistance.

DESCRIPTION OF EMBODIMENTS

Adhesive Composition

Figure 1:
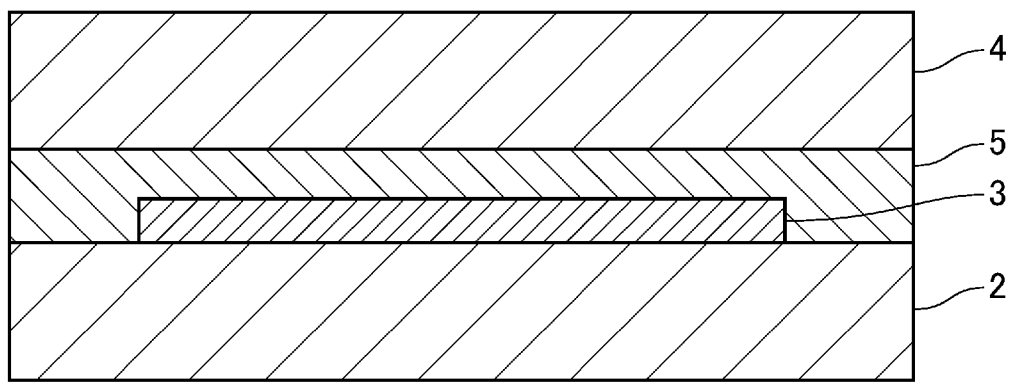
FIG. 1 is a cross-sectional view showing a configuration example of a printed wiring board.

The first embodiment of the adhesive composition according to the present technology is a thermosetting adhesive composition which contains, with respect to the total of 100 parts by mass of the adhesive composition, 70 to 90 parts by mass of a styrene elastomer (Component A), 5 to 25 parts by mass of a modified polyphenyleneether resin having a radical polymerizable group at an end (Component B; hereinafter referred to simply as modified polyphenyleneether resin), and totally 10 parts by mass or less of an epoxy resin (Component C), an epoxy resin curing agent (Component D), and a peroxide (Component E). The styrene elastomer in the adhesive composition according to the present technology has a styrene ratio of 42% or less. This composition can reduce the dielectric constant and the dielectric loss tangent even after the thermosetting. In the adhesive composition according to the present technology, the radical polymerizable group at an end of the modified polyphenyleneether resin is crosslinked with a peroxide by thermosetting. Thus, the glass transition temperature of the adhesive composition after curing can be adjusted to a range of, e.g., 80 to 170° C., and the adhesive composition can have an excellent folding endurance and heat resistance (for example, solder heat resistance) even after thermosetting.

Such an adhesive composition can be suitably used as an adhesive (interlayer adhesive) for a flexible printed wiring board, among other applications.

Styrene Elastomer

The styrene elastomer is a copolymer of styrene and an olefin (conjugated dienes such as butadiene and isoprene) and/or a hydrogenated product thereof. The styrene elastomer is a block copolymer having styrene as a hard segment and conjugated diene as a soft segment. Examples of styrene elastomers include styrene/butadiene/styrene block copolymers, styrene/isoprene/styrene block copolymers, styrene/ethylene/butylene/styrene block copolymers, styrene/ethylene/propylene/styrene block copolymers, and styrene/butadiene block copolymers. Further, a styrene/ethylene/butylene/styrene block copolymer, a styrene/ethylene/propylene/styrene block copolymer, and a styrene/butadiene block copolymer in which the double bond of the conjugated diene component is eliminated by hydrogenation (also referred to as a hydrogenated styrene elastomer) may be used.

The styrene ratio in the styrene elastomer is preferably less than 42%, more preferably 5 to 40%, still more preferably 10 to 35%, and particularly preferably 12 to 20%. This composition can improve the folding endurance, the peel strength (connection reliability), and the heat resistance.

Specific examples of styrene elastomers include TUFTEC H 1221 (styrene ratio 12%), TUFTEC MP 10 (styrene ratio 30%), TUFTEC H 1051 (Styrene ratio 42%), and TUFTEC H 1043 (Styrene ratio of 67% or more, all of the above manufactured by Asahi Kasei). Among these, TUFTEC H 1221 and TUFTEC MP 10 are preferable from the viewpoint of molecular weight and styrene ratio.

The content of the styrene elastomer in the adhesive composition may be 70 to 90 parts by mass or 80 to 90 parts by mass with respect to the total of 100 parts by mass of Components A, B, C, D, and E. The content of the styrene elastomer being less than 70 parts by mass tends to degrade folding endurance. When the content of the styrene elastomer exceeds 90 parts by mass, the content of other components (for example, Component B) is relatively small, thereby degrading heat resistance. One type of styrene elastomer may be used alone, or two or more types of styrene elastomer may be used in combination.

Modified Polyphenyleneether Resin

The modified polyphenyleneether resin has a polyphenyleneether chain in the molecule and a radical polymerizable group at an end. As described above, the radical polymerizable group at an end of the modified polyphenyleneether resin is crosslinked by the peroxide in the adhesive composition, whereby the glass transition temperature of the adhesive composition after curing can be adjusted to, e.g., 80 to 170° C., so that the adhesive composition will have an excellent folding endurance and solder heat resistance even after thermosetting. The modified polyphenyleneether resin preferably has two or more ethylenically unsaturated bonds as the radical polymerizable group in one molecule. In particular, from the viewpoint of compatibility with the above-mentioned styrene elastomer and dielectric properties of the adhesive composition, the modified polyphenyleneether resin preferably has at least one type of ethylenically unsaturated bond (e.g., (meth) acryloyl group, vinylbenzyl group) at both ends.

Polyphenyleneether resins not modified by a compound having a polymerizable group, i.e., polyphenyleneether resins having a hydroxyl group at an end are not preferable since they have an excessive polarity and therefore have an inferior compatibility with the styrene elastomer described above, thereby disabling the adhesive composition to be formed into a film.

A modified polyphenyleneether resin having vinylbenzyl groups at both ends, which is an example of the modified polyphenyleneether resin can be obtained, e.g., by producing a bifunctional phenylene ether oligomer by oxidative coupling of a bifunctional phenol compound and a monofunctional phenol compound and then converting the terminal phenolic hydroxyl group of the bifunctional phenylene ether oligomer into vinylbenzyl ether.

The weight-average molecular weight (or number average molecular weight) of the modified polyphenyleneether resin is preferably 1,000 to 3,000 from the viewpoint of compatibility with the styrene elastomer described above and the conformability to the level difference formed when thermally curing (pressing) a cover lay with a wiring pattern side of a wiring resin substrate having a base material and a wiring pattern.

Examples of the modified polyphenyleneether resin include OPE-2 St (modified polyphenyleneether resin having vinylbenzyl groups at both ends), OPE-2 EA (modified polyphenyleneether resin having acryloyl groups at both ends, all of the above manufactured by Mitsubishi Gas Chemical), and Noryl SA 9000 (modified polyphenyleneether resin having methacryloyl groups at both ends, manufactured by SABIC).

The content of the modified polyphenyleneether resin in the adhesive composition is 5 to 25 parts by mass, preferably 10 to 25 parts by mass, and more preferably 10 to 20 parts by mass, with respect to the total of 100 parts by mass of Components A, B, C, D, and E. The content of the modified polyphenyleneether resin exceeding 25 parts by mass tends to degrade folding endurance. In addition, the content of the modified polyphenyleneether resin being 5 parts by mass or more can further improve the heat resistance. One type of modified polyphenyleneether resin may be used alone, or two or more types of modified polyphenyleneether resin may be used in combination.

Peroxide

Peroxides are catalysts for promoting radical curing of unsaturated bonds. In the present technology, the peroxide cross-links the radical polymerizable group at the end of the polyphenylene ether resin having the radical polymerizable group to the aforementioned end by thermal curing. From the viewpoint of the storability (life) of the adhesive composition at ordinary temperature, a peroxide having a high reaction start temperature is preferably used. Particularly, the peroxide is preferably an organic peroxide having a decomposition temperature of 170° C. or higher to achieve a half-life of 1 minute. Examples of such organic peroxides include dicumyl peroxide (decomposition temperature to achieve a half-life of 1 minute is 175° C.), t-butyl cumyl peroxide (decomposition temperature to achieve a half-life of 1 minute is 173° C.), and 2,5-dimethyl-2,5-di (t-butyl peroxy) hexane (decomposition temperature to achieve a half-life of 1 minute is 194° C.). One type of peroxide may be used alone, or two or more types of peroxide may be used in combination.

Epoxy Resin

Examples of the epoxy resin include an epoxy resin having a naphthalene backbone, a bisphenol A type epoxy resin, a bisphenol F type epoxy resin, a phenol novolak type epoxy resin, an alicyclic epoxy resin, a siloxane type epoxy resin, a biphenyl type epoxy resin, a glycidyl ester type epoxy resin, a glycidyl amine type epoxy resin, and a hydantoin type epoxy resin, among others. In particular, from the viewpoint of the moldability of the film, it is preferable to use an epoxy resin which is in a liquid state at ordinary temperature, such as an epoxy resin having a naphthalene backbone, a bisphenol A type epoxy resin, or a bisphenol F type epoxy resin. One type of epoxy resin may be used alone, or two or more types of epoxy resin may be used in combination.

Epoxy Resin Curing Agent

The epoxy resin curing agent is a catalyst for promoting the curing reaction of the epoxy resin. The epoxy resin curing agent may be imidazole-based, phenol-based, amine-based, acid anhydride-based, and organic peroxide-based epoxy resin curing agent. In particular, from the viewpoint of the storability (life) of the adhesive composition at ordinary temperature, the epoxy resin curing agent is preferably a latent curing agent and is more preferably an encapsulated imidazole-based curing agent having latent properties. Improved storability at ordinary temperature further facilitates the management in the supply and use of the adhesive composition. Specifically, the epoxy resin curing agent may be a microcapsule-type latent curing agent comprising a latent imidazole-modified substance as a core coated with polyurethane. As a commercial product, e.g., Novacure 3941 (manufactured by ASAHI KASEI E-materials) can be used. One type of epoxy resin curing agent may be used alone, or two or more types of epoxy resin curing agent may be used in combination.

A possible another embodiment of the latent epoxy resin curing agent is an epoxy resin curing agent having a functional group for promoting the curing reaction of the epoxy resin such as an amine or an acid anhydride at the polymer side (e.g., styrene elastomers). In this case, forming the adhesive composition into a film will restrict the movement of the polymer chain containing the functional group for promoting the curing reaction of the epoxy resin, so that the latent property can be imparted to the polymer side. Examples of the polymer incorporating a functional group for promoting the curing reaction of an epoxy resin include an amine-modified styrene elastomer or an acid-modified styrene elastomer. Examples of such polymers include TUFTEC MP 10 (an amine-modified styrene elastomer), and TUFTEC M 1911 (an acid-modified styrene elastomer), among others.

The total content of the epoxy resin, the epoxy resin curing agent, and the peroxide in the adhesive composition is 10 parts by mass or less, and preferably 5 parts by mass or less, with respect to the total of 100 parts by mass of Components A, B, C, D, and E. The total content of the epoxy resin, the epoxy resin curing agent, and the peroxide exceeding 10 parts by mass tends to degrade dielectric properties. The lower limit of the total content of the epoxy resin, the epoxy resin curing agent, and the peroxide in the adhesive composition is not particularly limited, and may be, with respect to the total of 100 parts by mass of Components A, B, C, D, and E, 0.1 parts by mass or more, 0.5 parts by mass or more, or 1 parts by mass or more. It should be noted that the styrene elastomer in which the functional group for promoting the curing reaction of the epoxy resin is incorporated is included in the content of the styrene elastomer (Component A) and is not included in the content of the epoxy resin curing agent (Component D).

Other Components

The adhesive composition may further contain components other than Components A to E described above to the extent that the effect of the present technology is not impaired. Other components include organic solvents, adhesive-imparting agents such as silane coupling agents, and fillers for flowability adjustment and flame retardancy imparting, among others. Although the organic solvent is not particularly limited, examples thereof include an alcohol solvent, a ketone solvent, an ether solvent, an aromatic solvent, and an ester solvent. Among these, aromatic solvents and ester solvents are preferable from the viewpoint of solubility. One type of organic solvent may be used alone, or two or more types of organic solvent may be used in combination.

An adhesive composition of another embodiment (the second embodiment) according to the present technology may include, with respect to the total of 100 parts by mass of the adhesive composition, 70 to 90 parts by mass of the styrene elastomer; 5 to 25 parts by mass of a modified polyphenyleneether resin having a radical polymerizable group at an end; totally 10 parts by mass or less of an epoxy resin and a peroxide, wherein the styrene ratio of the styrene elastomer is 42% or less, and wherein the styrene elastomer has a functional group for promoting the curing reaction of the epoxy resin. In this embodiment, since the styrene elastomer has a functional group for promoting the curing reaction of the epoxy resin, it also has the function of the epoxy resin curing agent (Component D). Therefore, in this embodiment, there is no need to use an epoxy resin curing agent (Component D) separately, but an additional epoxy resin curing agent may be used in combination as long as the effect of the present technology is not impaired.

Thermosetting Adhesive Sheet

The thermosetting adhesive sheet according to the present technology includes a base material and a thermosetting adhesive layer made of the above-described adhesive composition formed on the base material, and is formed into a film shape. The thermosetting adhesive sheet is obtained, e.g., by diluting the above-described adhesive composition with a solvent, applying the diluted adhesive composition to at least one surface of the base material by, e.g., a bar coater or a roll coater so that the thickness after drying is 10 to 60 μm, and drying the adhesive sheet at a temperature of about 50 to 130° C. The base material may be a release-treated base material in which a base material such as a polyethylene terephthalate film or a polyimide film is appropriately subjected to release treatment with silicone.

The thickness of the thermosetting adhesive layer constituting the thermosetting adhesive sheet can be 1 to 100 μm or 1 to 30 μm as an example, although the thickness may be appropriately set according to the purpose.

Since the thermosetting adhesive layer constituting the thermosetting adhesive sheet is made of an adhesive composition having a low dielectric constant and a low dielectric loss tangent even after thermosetting and an excellent folding endurance and a heat resistance even after thermosetting as described above, it can be used, e.g., as an interlayer adhesive of a flexible printed wiring board, and for an application of bonding and fixing a terminal portion of the flexible printed wiring board and a connecting base material for backing the terminal portion. Further, the thermosetting adhesive sheet has an excellent peel strength and heat resistance after thermosetting, and storability at ordinary temperature.

Printed Wiring Board

The printed wiring board according to the present technology includes a wiring substrate having a base material and a wiring pattern, and a cover lay laminated on the wiring pattern of the substrate via a cured product of the adhesive composition (thermosetting adhesive layer) described above. The printed wiring board is obtained, e.g., by arranging a thermosetting adhesive layer of a thermosetting adhesive sheet between the wiring pattern side of the wiring substrate and the cover lay, and performing thermocompression bonding, thereby integrating the wiring substrate and the cover lay.

As with the adhesive composition described above, the wiring substrate preferably has an excellent electrical properties in a high-frequency region, e.g., a low dielectric constant and a low dielectric loss tangent in a frequency region of 1 to 10 GHz. Specific examples of the base material include base materials containing any one of a liquid crystal polymer (LCP), polytetrafluoroethylene, polyimide, and polyethylene naphthalate as a main component. Among these base materials, a base material containing a liquid crystal polymer as a main component (liquid crystal polymer film) is preferable. This is because the liquid crystal polymer has a moisture absorption rate much lower than polyimide and is less susceptible to the use environment.

An example of a configuration of a printed wiring board using an adhesive composition according to the present technology will be described. In the printed wiring board 1 shown in FIG. 1, a copper foil 3 side of a wiring substrate (copper-clad laminate: CCL) provided with a liquid crystal polymer film 2 and the copper foil (rolled copper foil) 3 and a liquid crystal polymer film 4 are laminated via a cured product layer 5 made of the above-described adhesive composition (thermosetting adhesive layer).

Figure 2:
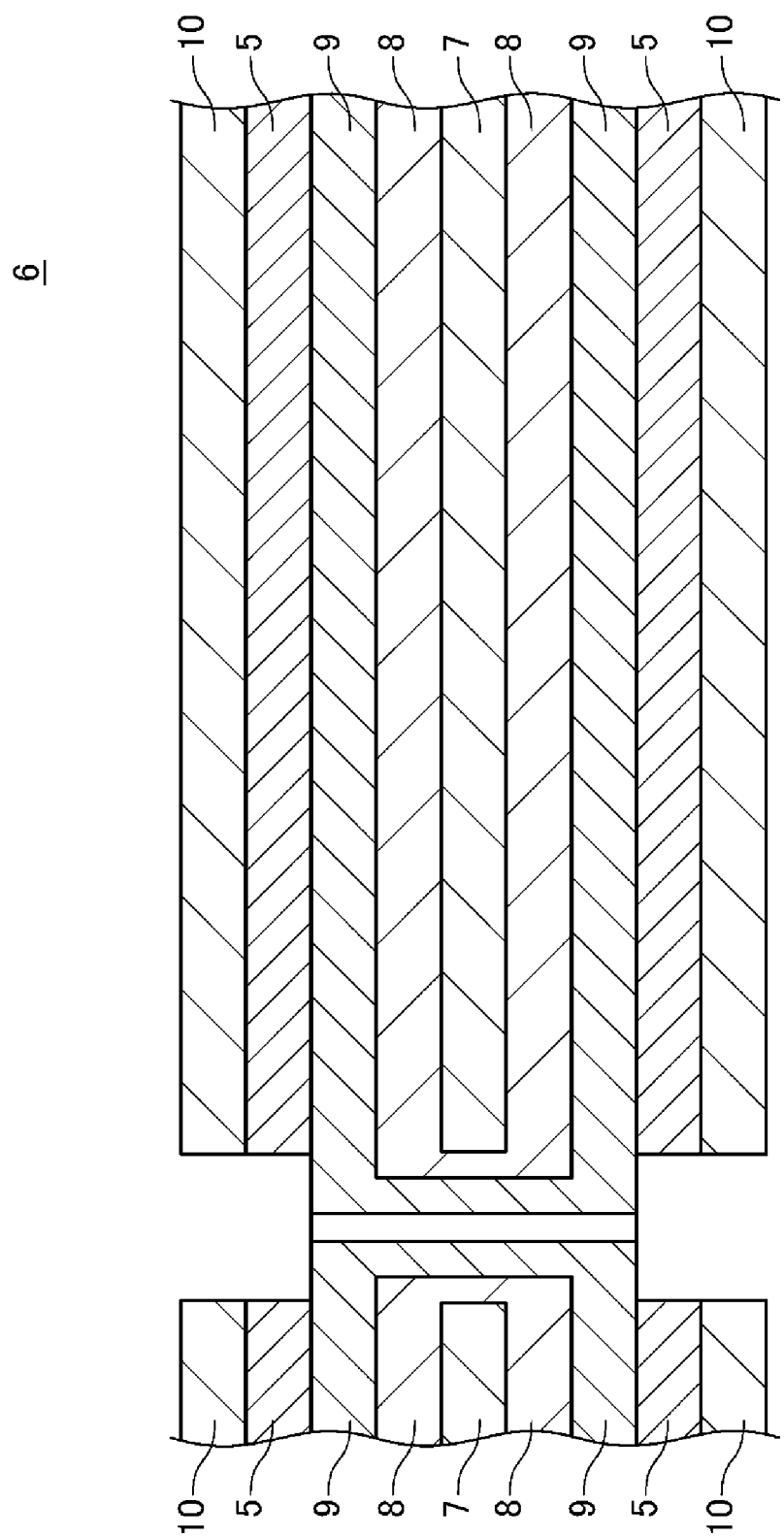
FIG. 2 is a cross-sectional view showing an example of a configuration of a multilayer printed wiring board.

Furthermore, the printed wiring board may have a multilayer structure as shown in FIG. 2, for example. The printed wiring board 6 shown in FIG. 2 includes: a wiring substrate provided with a polyimide layer 7 (25 μm thick), a copper foil 8 (18 μm thick), and a copper plated layer 9 (10 μm thick); and a cover lay 10 (25 μm thick) laminated on the copper plated layer 9 side of the wiring substrate via a cured product layer 5 (35 μm thick) made of the above-described adhesive composition (thermosetting adhesive layer) (total thickness of 201 μm).

EXAMPLES

Examples of the present technology will be described below. However, the present technology is not limited to these examples.

Component A

TUFTEC H 1221: hydrogenated styrene thermoplastic elastomer (styrene ratio 12%), manufactured by Asahi Kasei
TUFTEC MP 10: amine-modified hydrogenated styrene thermoplastic elastomer (styrene ratio 30%), manufactured by Asahi Kasei
TUFTEC H 1051: hydrogenated styrene thermoplastic elastomer (styrene ratio 42%), manufactured by Asahi Kasei
TUFTEC H 1043: hydrogenated styrene thermoplastic elastomer (styrene ratio 67%), manufactured by Asahi Kasei Component B OPE-2St2200: modified polyphenyleneether resin having vinylbenzyl groups at both ends (Mn 2,200), manufactured by MITSUBISHI GAS CHEMICAL
SA9000: modified polyphenyleneether resin having methacryloyl groups at both ends (Mw 1,700), manufactured by SABIC
S 201A: polyphenylene ether resin having hydroxyl groups at both ends, manufactured by Asahi Kasei Component C JER828: epoxy resin, manufactured by Mitsubishi Chemical
4032D: naphthalene epoxy resin, manufactured by DIC Component D Novacure 3941: microcapsule type latent curing agent having imidazole modified substance as a core coated with polyurethane, manufactured by ASAHI KASEI E-materials
2E4MZ: 2-ethyl-4-methylimidazole (non-latent imidazole)

Component E

Dicumyl peroxide (decomposition temperature to achieve a half-life of 1 minute is 175° C.)
Dilauroyl peroxide: (decomposition temperature to achieve a half-life of 1 minute is 116° C.)

Preparation of Thermosetting Adhesive Composition

The components shown in Table 1 were weighed to obtain the mass shown in Table 1 and uniformly mixed in an organic solvent containing toluene and ethyl acetate to prepare a thermosetting adhesive composition (coating material for forming thermosetting adhesive layer).

Preparation of Thermosetting Sheet

Each of the obtained thermosetting adhesive compositions was applied to a release-treated polyethylene terephthalate film and dried in a drying furnace at 50 to 130° C. to prepare a thermosetting adhesive sheet having the polyethylene terephthalate film and a thermosetting adhesive layer having a thickness of 25 μm.

Evaluation

Evaluation of coatability (film state) of thermosetting adhesive layer-forming coating
During the preparation of the above-described thermosetting sheet, the coatability of the thermosetting adhesive composition was evaluated according to the following criteria. The results are shown in Table 1.
A: The compatibility of the adhesive composition is good, and the evaluation described later can be performed in the film state.
B: The compatibility of the adhesive composition is bad, and the evaluation described later cannot be performed in the film state.

Dielectric Constant

The adhesive sheets prepared in Examples and Comparative Examples were laminated to each other to prepare a test piece having a thickness of 1 mm, and then the test piece was thermally cured at 180° C. and 1.0 MPa for 1 hour to prepare a test piece for evaluation. The dielectric constant of the test piece for evaluation was determined by using a dielectric constant measuring device (manufactured by AET) at a measurement temperature of 23° C. and a measurement frequency of 10 GHz. The results are shown in Table 1.
- A: Dielectric constant is less than 2.3.
- B: Dielectric constant is 2.3 or more and less than 2.4.
- C: Dielectric constant is 2.4 or more and less than 2.6.
- D: Dielectric constant is 2.6 or more.

Dielectric Loss Tangent

The dielectric loss tangent of the test piece for evaluation was obtained by the same method as the measurement of the dielectric constant described above. The results are shown in Table 1.
- A: Dielectric loss tangent is less than 0.002.
- B: Dielectric loss tangent is 0.002 or more and less than 0.0035.
- C: Dielectric loss tangent is 0.0035 or more and less than 0.005.
- D: Dielectric loss tangent is 0.005 or more.

Peel Strength

The obtained thermosetting adhesive sheet was cut into a strip of a predetermined size (2cm×5cm), and the cut thermosetting adhesive layer was temporarily pasted to a liquid crystal polymer film having a size of 2 cm×7 cm×50 µm (thickness) by a laminator set at 100° C., and then the base material (polyethylene terephthalate film) was removed to expose the thermosetting adhesive layer. Upon the exposed thermosetting adhesive layer, a rolled copper foil surface (surface without roughening process) of a copper-clad laminate (CCL consisting of a rolled copper foil with a thickness of 12 µm and a liquid crystal polymer film with a thickness of 50 µm) of the same size was stacked and thermally cured at 180° C. and 1.0 MPa for 1 hour. Thus, samples were prepared.

The obtained samples were subjected to a 90 degree peeling test at a peeling speed of 50 mm/min, and the force required for peeling (initial peel strength and peel strength after reliability test) was measured. The results are shown in Table 1.

Initial peel strength (measured as it is after thermosetting under the above-described conditions of 180° C. and 1.0 MPa)
- A: Peel strength is 8 N/cm or more.
- B: Peel strength is 6 N/cm or more and less than 8 N/cm.
- C: Peel strength is 4 N/cm or more and less than 6 N/cm.
- D: Peel strength is less than 4 N/cm.

Peel strength after the reliability test (85° C., 85% RH (relative humidity), 240 hr (that is, after thermosetting under the above-described conditions of 180° C. and 1.0 MPa, the sample is placed in an environment of 85° C. and 85% RH for 240 hours, and measured 3 hours after removal.))
- A: Peel strength is 7 N/cm or more.
- B: Peel strength is 5 N/cm or more and less than 7 N/cm.
- C: Peel strength is 3 N/cm or more and less than 5 N/cm.
- D: Peel strength is less than 3 N/cm.

Heat Resistance (Solder Heat Resistance)

The sample was subjected three times through solder float tests with a top temperature of 288° C. for 10 seconds, and the appearance of the sample after passing through the tests was checked to evaluate the presence or absence of peeling or swelling according to the following criteria. The results are shown in Table 1.
- A: No abnormality was occurred after the third test.
- B: No abnormality was occurred at the second test, and an abnormality such as peeling and swelling was occurred at the third test.
- C: No abnormality was occurred after the first test, and an abnormality such as peeling and swelling was occurred after the second test.
- D: An abnormality such as peeling and swelling was occurred at the first test.

Folding Endurance

Figure 3:
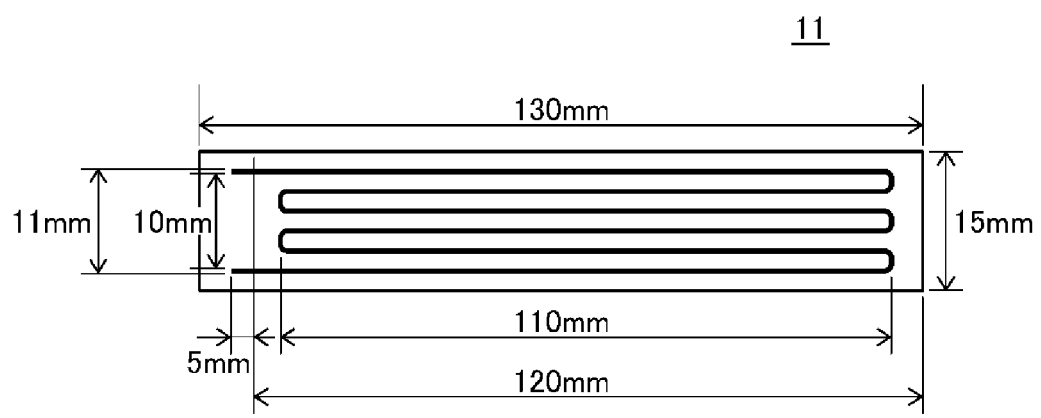
FIG. 3 is a plan view showing an example of a structure of a TEG used in a folding endurance test.
Figure 4:
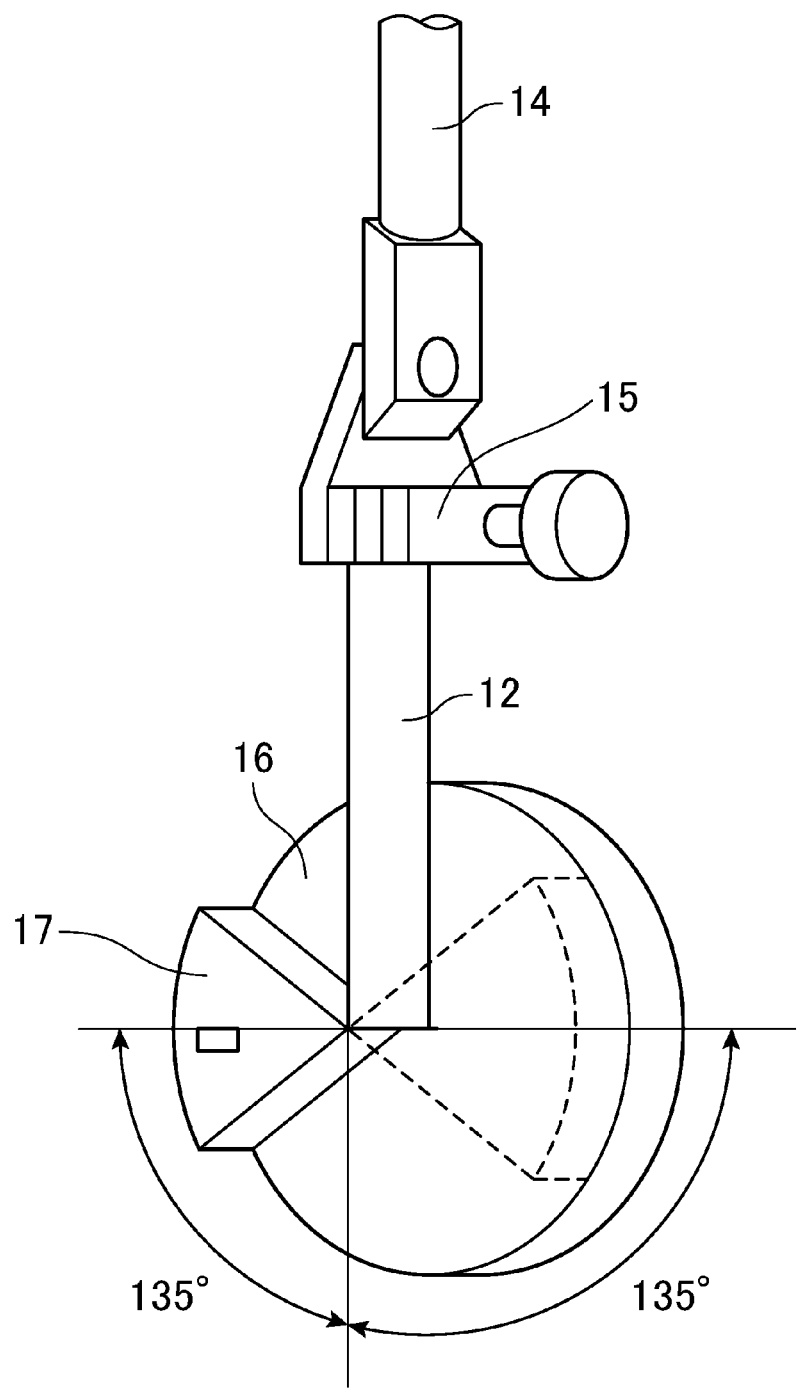
FIG. 4 is a perspective view of a measuring device used in a folding endurance test.

The obtained thermosetting adhesive sheet was cut into a strip of a predetermined size (1.5 cm×12 cm), and the cut thermosetting adhesive layer was temporarily pasted to a liquid crystal polymer film having a size of 1.5 cm×12 cm×50 µm (thickness) by a laminator set at 100° C., and then the base material (polyethylene terephthalate film) was removed to expose the thermosetting adhesive layer. Upon the exposed thermosetting adhesive layer, an FPC-TEG for the MIT folding endurance test was stacked and thermally cured at 180° C. and 1.0 MPa for 1 hour. FIG. 3 shows a structure of the TEG 11 for the MIT folding endurance test. The TEG 11 is formed by forming copper wiring from CCL composed of a liquid crystal polymer film (50 µm thick) as a base material and rolled copper foil (12 µm thick). The MIT folding endurance test was carried out by setting a prepared test piece 12 in a MIT type folding endurance tester 13 having the structure shown in FIG. 4. The test was conducted at a bending angle of 135°, a bending clamp angle R of 0.38, and a test speed of 175 cpm. The number of folds to break the copper wiring was counted. The results are shown in Table 1.
- A: The number of folds to break is 1,200 or more.
- B: The number of folds to break is 600 or more and less than 1,200.
- C: The number of folds to break is 300 or more and less than 600.
- D: The number of folds to break is less than 300.

Life Evaluation

After the thermosetting sheet was stored at ordinary temperature for four months, the same evaluation as the above-described evaluation of the peel strength was performed. The reduction rate was determined by comparing with the peel strength evaluated immediately after the thermosetting adhesive sheet was prepared. The results are shown in Table 1.
- A: Decrease in peel strength is less than 10%.
- B: Decrease in peel strength is 10% or more and less than 30%.
- C: Decrease in peel strength is 30% or more.

Measurement of Glass Transition Temperature

Figure 5:
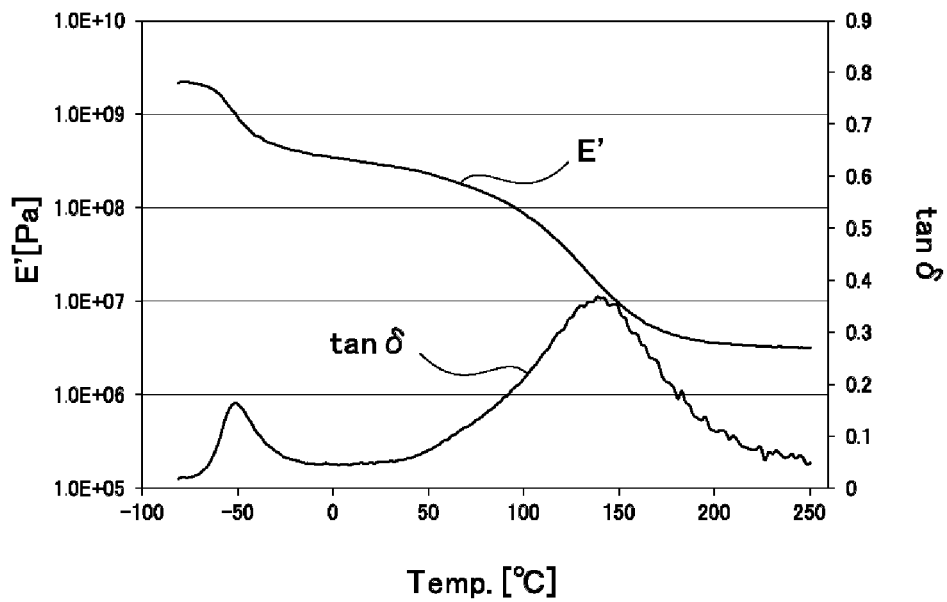
FIG. 5 is a graph illustrating the glass transition temperature of a thermosetting adhesive sheet produced by using the adhesive composition of Example 3.
Figure 6:
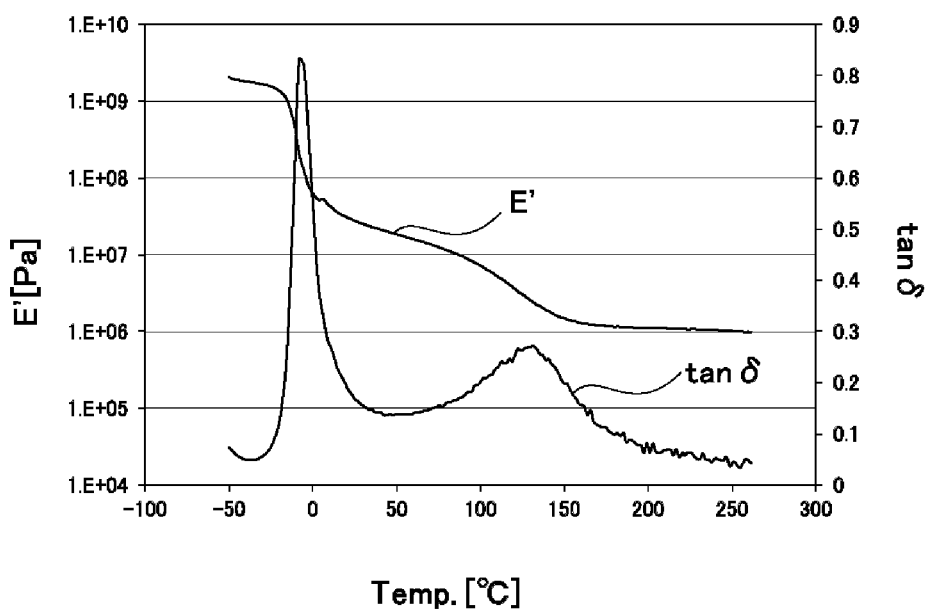
FIG. 6 is a graph illustrating the glass transition temperature of a thermosetting adhesive sheet produced by using the adhesive composition of Example 10.

The produced thermosetting adhesive sheets were laminated together to produce a test piece having a thickness of 600 µm, and the test piece was thermally cured at 180° C. and 1.0 MPa for 1 hour to produce a test piece for evaluation. Using this test piece, the glass transition temperature, which appeared when the temperature was raised from −60° C. to 250° C. at a rate of 10° C./min, was determined by using a dynamic viscoelasticity measuring device manufactured by TA Instruments). In the case of a copolymer or a mixture of a large number of components, a plurality of tanδ peaks may be detected, and in this case, the temperature of the tanδ peak having a larger value (having a larger change in the elastic modulus) was regarded as the glass transition temperature. The results are shown in Table 1 and FIGS. 5 and 6. FIG. 5 is a graph illustrating the glass transition temperature of a thermosetting adhesive sheet produced by using the adhesive composition of Example 3. In FIG. 5, tanδ peaks were detected around −50° C. and around 140° C. on the horizontal axis, and the higher temperature of the tanδ peak (140° C.) was regarded as the glass transition temperature. FIG. 6 is a graph illustrating the glass transition temperature of a thermosetting adhesive sheet produced by using the adhesive composition of Example 10. In FIG. 6, tanδ peaks were detected around −10° C. and around 120° C. on the horizontal axis, and the higher temperature of the tanδ peak (−10° C.) was regarded as the glass transition temperature.

In addition, from the results of Examples 3 to 6 corresponding to the second embodiment, it was found that the adhesive composition containing, with respect to the total of 100 parts by mass of the adhesive composition, 70 to 90 parts by mass of a styrene elastomer (Component A) having a styrene ratio of 42% or less and a functional group for promoting the curing reaction of the epoxy resin, 5 to 25 parts by mass of a modified polyphenyleneether resin (Component B) having a radical polymerizable group at an end, and totally 10 parts by mass or less of an epoxy resin (Component C) and an a peroxide (Component E) would have a low dielectric constant, a low dielectric loss tangent, an excellent folding endurance, and an excellent heat resistance even after thermosetting.

From the result of Example 7, it was found to be difficult to improve the folding endurance and the peel strength when the styrene ratio of the styrene elastomer exceeds 42%.

From the result of Example 8, it was found to be difficult for the peroxide-free composition to improve the heat resistance because the modified polyphenyleneether resin is not substantially crosslinked by heating.

From the result of Experiment Example 9, it was found that the content of the modified polyphenyleneether resin being more than 25 parts by mass would degrade the folding endurance.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 | Ex. 14 |
|---|---|---|---|---|---|---|---|---|---|---|---|---|---|---|---|
| Component A | TUFTEC H1221 (styrene ratio 12%) | 75 | 70 | 0 | 0 | 0 | 0 | 0 | 77 | 65 | 0 | 70 | 80 | 80 | 80 |
| | TUFTEC MP10 (styrene ratio 30%) | 0 | 0 | 76 | 86 | 76 | 0 | 0 | 0 | 0 | 93 | 0 | 0 | 0 | 0 |
| | TUFTEC H1051 (styrene ratio42%) | 0 | 0 | 0 | 0 | 0 | 70 | 0 | 0 | 0 | 0 | 0 | 0 | 0 | 0 |
| | TUFTEC H1043 (styrene ratio67%) | 0 | 0 | 0 | 0 | 0 | 0 | 75 | 0 | 0 | 0 | 0 | 0 | 0 | 0 |
| Component B | OPE-2St2200 | 20 | 0 | 0 | 0 | 20 | 25 | 0 | 20 | 0 | 0 | 15 | 0 | 0 | 0 |
| | SA9000 | 0 | 25 | 20 | 10 | 0 | 0 | 20 | 0 | 30 | 3 | 0 | 0 | 15 | 15 |
| Component B' | S201A | 0 | 0 | 0 | 0 | 0 | 0 | 0 | 0 | 0 | 0 | 0 | 15 | 0 | 0 |
| Component C | JER828 | 2 | 2 | 2 | 2 | 0 | 2 | 2 | 2 | 2 | 2 | 10 | 2 | 2 | 2 |
| | 4032D | 0 | 0 | 0 | 0 | 2 | 0 | 0 | 0 | 0 | 0 | 0 | 0 | 0 | 0 |
| Component D | Novacure 3941 | 1 | 1 | 0 | 0 | 0 | 1 | 1 | 1 | 1 | 0 | 3 | 1 | 0 | 1 |
| | 2E4MZ | 0 | 0 | 0 | 0 | 0 | 0 | 0 | 0 | 0 | 0 | 0 | 0 | 1 | 0 |
| Component E | Dicumyl peroxide | 2 | 2 | 2 | 2 | 2 | 2 | 2 | 0 | 2 | 2 | 2 | 2 | 2 | 0 |
| | Dilauroyl peroxide | 0 | 0 | 0 | 0 | 0 | 0 | 0 | 0 | 0 | 0 | 0 | 0 | 0 | 2 |
| | Total | 100 | 100 | 100 | 100 | 100 | 100 | 100 | 100 | 100 | 100 | 100 | 100 | 100 | 100 |
| | Film state | A | A | A | A | A | A | A | A | A | A | A | B | A | A |
| Dielectric properties | Dk | A | A | A | A | A | A | A | A | A | A | C | — | A | A |
| | Df | A | A | A | A | A | A | A | A | A | B | D | — | A | A |
| Peel | Cu/Cu initial | A | B | A | A | A | B | C | B | B | A | A | — | B | B |
| | Cu/Cu reliability | B | B | A | A | A | B | D | B | C | B | A | — | B | B |
| | Heat resistance | A | A | A | A | A | A | B | D | A | C | A | — | A | A |
| | Folding endurance | A | A | A | A | A | B | D | A | D | B | A | — | A | A |
| | Life | A | A | A | A | A | A | A | A | A | A | A | — | C | C |
| | Tg | 110 | 105 | 140 | 90 | 140 | 150 | 160 | −20° C. | 160 | −10° C. | 115 | — | 105 | 100 |

From the results of Examples 1, 2, 6, 13, and 14 corresponding to the first embodiment in Table 1, it was found that the adhesive composition containing, with respect to the total of 100 parts by mass of the adhesive composition, 70 to 90 parts by mass of a styrene elastomer (Component A) having a styrene ratio of 42% or less, 5 to 25 parts by mass of a modified polyphenyleneether resin (Component B) having a radical polymerizable group at an end, and totally 10 parts by mass or less of an epoxy resin (Component C), an epoxy resin curing agent (Component D), and a peroxide (Component E) would have a low dielectric constant, a low dielectric loss tangent, an excellent folding endurance, and an excellent heat resistance even after thermosetting.

From the result of Example 10, it was found that the content of the styrene elastomer being more than 90 parts by mass would make the content of the modified polyphenyleneether resin relatively small, so that it is difficult to improve the heat resistance.

From the result of Example 11, it was found to be difficult to reduce the dielectric loss tangent when the total amount of the epoxy resin, the epoxy resin curing agent, and the peroxide exceeds 10 parts by mass.

For Example 12 of the polyphenylene ether resin having a hydroxyl group at an end, it was impossible to evaluate the dielectric constant, the dielectric loss tangent, the peel strength, the heat resistance, and the folding endurance due to a poor condition of the film.

From the result of Examples, it was found that the content of the modified polyphenyleneether resin being 10 to 20 parts by mass would reduce the dielectric constant and the dielectric loss tangent and improve the folding endurance and the heat resistance.

From the results of Examples, it was found that the styrene ratio of the styrene elastomer being 30% or less would improve the dielectric property, the peel strength, the heat resistance, and the folding endurance.

From the results of Examples, it was found that using a latent epoxy resin curing agent or incorporating a functional group for promoting the curing reaction of the epoxy resin into the styrene elastomer would improve the storability at ordinary temperature.

From the results of Examples, it was found that using the organic peroxide having a decomposition temperature of 170° C. or higher to achieve a half-life of 1 minute would improve the storability at ordinary temperature.

From the result of Examples 3 to 5, it was found that, in spite of extremely low values such as a dielectric constant (Dk) of 2.3 or less and a dielectric loss tangent (DO of less than 0.002 at 10 GHz, a very high adhesive strength of 8 N/cm or more could be achieved for a liquid crystal polymer film and a rolled copper foil not subjected to a surface roughening process.

REFERENCE SIGNS LIST

1 printed wiring board, 2 liquid crystal polymer film, 3 copper foil, 4 liquid crystal polymer film, 5 cured product layer composed of adhesive composition, 6 printed wiring board, 7 polyimide layer, 8 copper foil, 9 copper plating layer, 10 cover lay, 11 TEG, 12 test piece, 13 MIT type folding endurance tester, 14 plunger, 15 upper chuck, 16 rotary chuck, 17 bending top

The invention claimed is:

1. An adhesive composition consisting of, with respect to a total of 100 parts by mass of the adhesive composition:
   70 to 90 parts by mass of a styrene elastomer;
   10 to 20 parts by mass of a modified polyphenyleneether resin having a radical polymerizable group at an end;
   in total 10 parts by mass or less of an epoxy resin and a peroxide; and
   optionally one or more additional components selected from the group consisting of an organic solvent, a silane coupling agent, a filler for flowability adjustment and a filler for flame retardancy imparting,
   wherein a styrene ratio of the styrene elastomer is less than 42%,
   wherein the styrene elastomer is an amine-modified styrene elastomer, and
   wherein a glass transition temperature of a cured product of the adhesive composition is 80 to 170° C.

2. The adhesive composition according to claim 1, wherein the styrene ratio of the styrene elastomer is 10 to 30%.

3. The adhesive composition according to claim 1, wherein the peroxide is an organic peroxide having a decomposition temperature of 170° C. or higher to achieve a half-life of 1 minute.

4. The adhesive composition according to claim 1, wherein the modified polyphenyleneether resin has an ethylenically unsaturated bond at an end.

5. A thermosetting adhesive sheet comprising a base material and a thermosetting adhesive layer formed on the base material and composed of the adhesive composition according to claim 1 formed on the base material.

6. A printed wiring board comprising:
   a wiring resin substrate having a base material and a wiring pattern; and
   a cover lay laminated on the wiring pattern of the resin substrate via a cured product of an adhesive composition,
   wherein the adhesive composition consists of, with respect to a total of 100 parts by mass of the adhesive composition:
   70 to 90 parts by mass of a styrene elastomer;
   10 to 20 parts by mass of a modified polyphenyleneether resin having a radical polymerizable group at an end;
   in total 10 parts by mass or less of an epoxy resin and a peroxide; and
   optionally one or more additional components selected from the group consisting of an organic solvent, a silane coupling agent, a filler for flowability adjustment and a filler for flame retardancy imparting,
   wherein a styrene ratio of the styrene elastomer is less than 42%,
   wherein the styrene elastomer is an amine-modified styrene elastomer, and
   wherein a glass transition temperature of the cured product of the adhesive composition is 80 to 170° C.

7. The printed wiring board according to claim 6, wherein the base material is a liquid crystal polymer film.

8. The printed wiring board according to claim 6, wherein the styrene ratio of the styrene elastomer is 10 to 30%.

9. The printed wiring board according to claim 6, wherein the peroxide is an organic peroxide having a decomposition temperature of 170° C. or higher to achieve a half-life of 1 minute.

10. The printed wiring board according to claim 6, wherein the modified polyphenyleneether resin has an ethylenically unsaturated bond at an end.

* * * * *